United States Patent
Lesartre et al.

(10) Patent No.: US 9,742,403 B2
(45) Date of Patent: Aug. 22, 2017

(54) STATE-RETAINING LOGIC CELL

(71) Applicant: Hewlett-Packard Development Company, L.P., Houston, TX (US)

(72) Inventors: Gregg B. Lesartre, Fort Collins, CO (US); Robert J. Brooks, Fort Collins, CO (US); Brent Edgar Buchanan, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/781,865

(22) PCT Filed: Apr. 2, 2013

(86) PCT No.: PCT/US2013/034909
§ 371 (c)(1),
(2) Date: Oct. 1, 2015

(87) PCT Pub. No.: WO2014/163616
PCT Pub. Date: Oct. 9, 2014

(65) Prior Publication Data
US 2016/0056821 A1    Feb. 25, 2016

(51) Int. Cl.
*H03K 19/00*    (2006.01)
*H03K 3/037*    (2006.01)
(Continued)

(52) U.S. Cl.
CPC ....... *H03K 19/0008* (2013.01); *G11C 14/009* (2013.01); *H03K 3/037* (2013.01); *H03K 3/0375* (2013.01); *H03K 19/094* (2013.01)

(58) Field of Classification Search
CPC ... H03K 19/0008; H03K 3/037; H03K 19/094
(Continued)

(56) References Cited

U.S. PATENT DOCUMENTS

| | | |
|---|---|---|
| 4,298,961 A | 11/1981 | Hotta et al. |
| 6,141,248 A | 10/2000 | Forbes et al. |

(Continued)

FOREIGN PATENT DOCUMENTS

| | | | |
|---|---|---|---|
| CN | 101821810 A | 9/2010 | |
| KR | 10-2010-0037161 | 4/2010 | |
| WO | WO 2014163616 A1 * | 10/2014 | ........... H03K 19/094 |

OTHER PUBLICATIONS

International Search Report and Written Opinion dated Dec. 23, 2013 issued on PCT Patent Application No. PCT/US2013/034909 dated Apr. 2, 2013, Korean Intellectual Property Office.
(Continued)

*Primary Examiner* — Dylan White
(74) *Attorney, Agent, or Firm* — Mannava & Kang, P.C.

(57) ABSTRACT

A state-retaining logic cell may include a plurality of inverters, an output node non-volatile (NVM) storage cell, and an input node NVM storage cell. The plurality of inverters may include a feed-forward inverter and a feed-back inverter disposed in a back-to-back arrangement. The output node NVM storage cell may include first and second terminals, where the first terminal is connected adjacent an output node of the feed-forward and the feed-back inverters, and the second terminal is connected to a programming rail. The input node NVM storage cell may include first and second terminals, where the first terminal is connected adjacent an input node of the feed-forward and the feed-back inverters, and the second terminal is connected to the programming rail.

18 Claims, 7 Drawing Sheets

(51) Int. Cl.
  *H03K 19/094*   (2006.01)
  *G11C 11/02*    (2006.01)
  *G11C 14/00*    (2006.01)

(58) Field of Classification Search
  USPC .............................................. 326/37–41, 47
  See application file for complete search history.

(56) References Cited

U.S. PATENT DOCUMENTS

| | | | |
|---|---|---|---|
| 6,285,575 B1 | 9/2001 | Miwa | |
| 6,683,477 B1* | 1/2004 | Lall | H03K 19/177 |
| | | | 326/121 |
| 6,876,226 B2 | 4/2005 | Buchmann et al. | |
| 7,050,323 B2 | 5/2006 | Takahashi et al. | |
| 7,348,804 B2 | 3/2008 | Hoberman et al. | |
| 8,295,079 B2* | 10/2012 | Yamamoto | G11C 14/0081 |
| | | | 365/145 |
| 2003/0071651 A1* | 4/2003 | Vora | H03K 19/17736 |
| | | | 326/38 |
| 2004/0052106 A1* | 3/2004 | Ohtani | G11C 14/00 |
| | | | 365/158 |
| 2006/0250843 A1* | 11/2006 | Bertin | B82Y 10/00 |
| | | | 365/185.08 |
| 2009/0058485 A1* | 3/2009 | Berzins | H03K 3/356008 |
| | | | 327/203 |
| 2011/0085372 A1 | 4/2011 | Fackenthal | |
| 2011/0121876 A1* | 5/2011 | Frederick, Jr. | H03K 3/356156 |
| | | | 327/198 |
| 2011/0273925 A1 | 11/2011 | Yamamoto et al. | |
| 2011/0280073 A1* | 11/2011 | Chiu | G11C 13/0002 |
| | | | 365/185.08 |
| 2014/0139262 A1* | 5/2014 | Penzes | G06F 17/5045 |
| | | | 326/33 |

OTHER PUBLICATIONS

Onkaraiah, et al;Bipolar ReRAM Based Non-Volatile Flip-flops for Low-Power Architectures; IEEE 2012; pp. 417-420.

Turkyilmaz, et al; RRAM-based FPGA for "Normally Off, Instantly On" Applications; IEEE/ACM Nano;Mar. 2012; pp. 101-1082; pp. 101-108.

Partial Supplementary European Search Report dated Nov. 22, 2016 for EP application No. 13881264.9; pp. 9.

* cited by examiner

500

```
PROGRAM THE STATE-RETAINING LOGIC CELL BY PULSING THE
PROGRAMMING RAIL FROM APPROXIMATELY V/2 VOLTS TO
APPROXIMATELY 0 VOLTS
502
              │
              ▼
PROGRAM THE STATE-RETAINING LOGIC CELL BY FURTHER
PULSING THE PROGRAMMING RAIL TO APPROXIMATELY
V VOLTS
504
              │
              ▼
PROGRAM THE STATE-RETAINING LOGIC CELL BY FURTHER
RETURNING THE PROGRAMMING RAIL TO APPROXIMATELY V/2 VOLTS
506
```

STATE-RETAINING LOGIC CELL

CLAIM FOR PRIORITY

The present application is a national stage filing under 35 U.S.C. §371 of PCT application number PCT/US2013/034909, having an international filing date of Apr. 2, 2013, the disclosure of which is hereby incorporated by reference in its entirety.

BACKGROUND

Very-large-scale integration (VLSI) is the process of creating integrated circuits by combining transistors into a single chip. Complementary metal-oxide-semiconductor (CMOS) technology is a type of VLSI that is typically used to construct integrated circuits. CMOS technology has been used in microprocessors, microcontrollers, static random-access memory (SRAM), and other digital logic circuits. CMOS technology may also be used in analog circuits such as image sensors, data converters, and integrated transceivers for communication. During typical use, devices that use such technology are often powered down by initiating a full system power off, or by local power gating to save power. Further, when the device or components of the device need to become operational, the device or the components of the device may be powered back up. Such powering down and powering back up cycles add delays related to the use of such devices.

BRIEF DESCRIPTION OF DRAWINGS

Features of the present disclosure are illustrated by way of example and not limited in the following figure(s), in which like numerals indicate like elements, in which:

FIG. 5 illustrates a method for state retention for a state-retaining logic cell, according to an example of the present disclosure;

DETAILED DESCRIPTION

Figure 1:
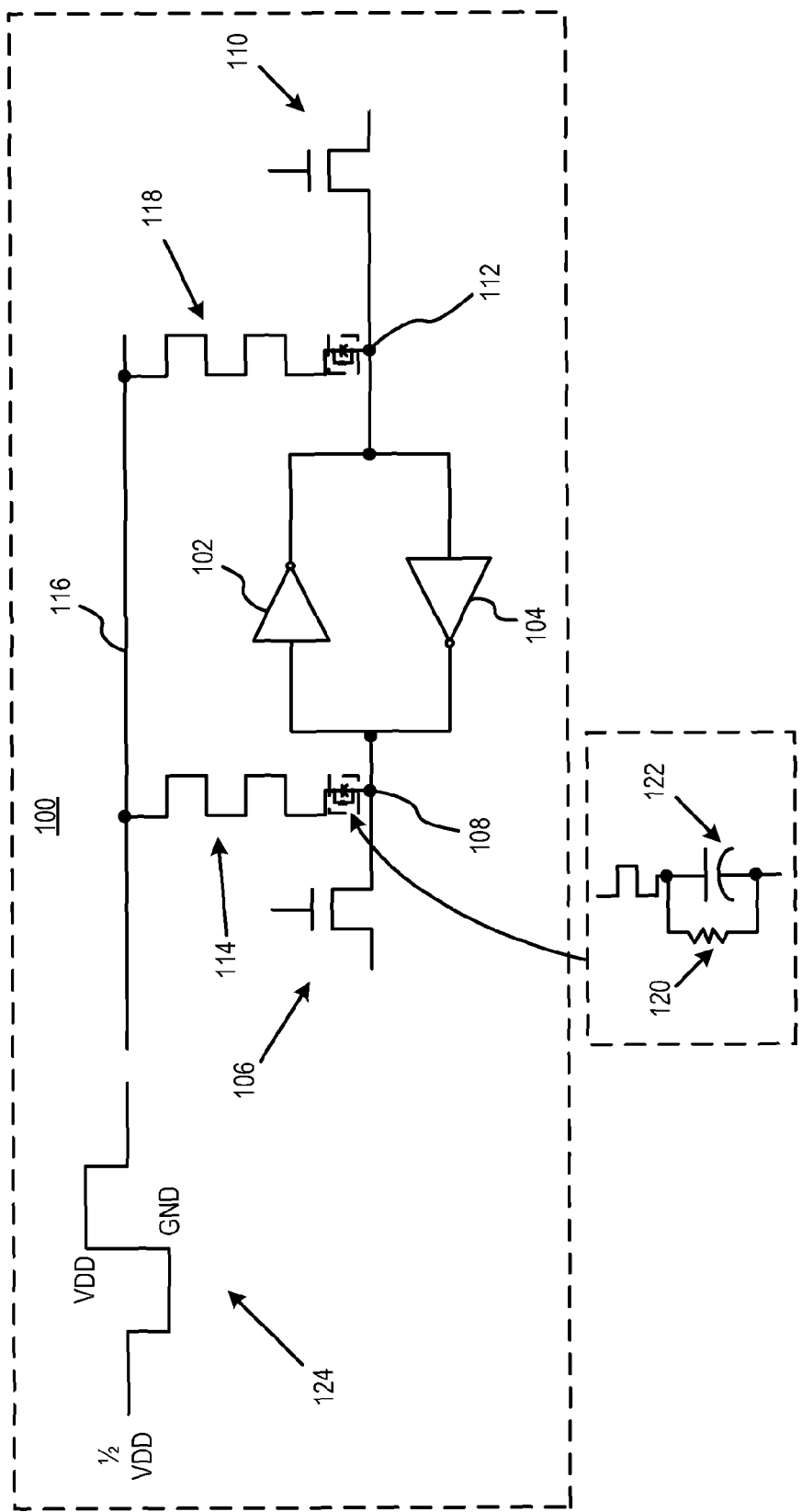
FIG. 1 illustrates an architecture of a state-retaining logic cell, according to an example of the present disclosure.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

VLSI based integrated circuits may include components such as CMOS latches that typically lose their state when powered down (e.g., a full system power off, or local power gating to save power), and power back up in an undetermined (i.e., random) state. Since logic paths for such components may be many clock cycles deep, clearing out a random state or configuring a circuit including such components for a specific operational state may add delays to use of devices that include such components. These factors may further add design complexity, and increased power usage for devices that include such components.

According to an example, a state-retaining logic cell is disclosed herein for use with devices that use components such as CMOS latches. The state-retaining logic cell may incorporate non-volatile memory (NVM) to preserve a state of the logic cell across power-down events. For example, the state-retaining logic cell may incorporate a bipolar resistive random-access memory (ReRAM) to preserve a state of the logic cell across power-down events. Other NVM technologies, such as phase-change memory (PCRAM), magnetoresistive random-access memory (MRAM), and ferroelectric RAM (FERAM) that include properties similar to those of the ReRAM may also be used with the state-retaining logic cell. For example, other NVM technologies for which a resistance change is indicative of a state may also be used with the state-retaining logic cell. For the example of a ReRAM, the ReRAM may be controlled by applying a high positive voltage to set, a high negative voltage to reset, and by applying a low voltage to read. The use of such state-retaining logic cells in a device may eliminate steps or additional circuits otherwise needed to obtain a useful logic state of the device prior to resuming operation. With a sufficient number of state-retaining logic cells distributed throughout a circuit for a device, the state of the circuit may be fully preserved when powered off, allowing the circuit to virtually instantaneously resume operation when power is restored.

The state-retaining logic cell may provide for efficient capture and restoration of latched values across power cycles. Thus, for a device that includes state-retaining logic cells, the design of the device may provide for higher incidences of entry into low power states, faster device restart after a power loss event, and faster device start and restart by application of reset values stored in the state-retaining logic cells. By routinely storing a logic state in real time, for example, at each state change, at detection of imminent power down, or at other selected times, the state-retaining logic cell may provide for retention and availability of a state in the event of power loss. Further, upon the restoration of power, the stored value of the state-retaining logic cell may be read and the associated circuit and device may be virtually instantaneously placed in a desired state.

FIG. 1 illustrates an architecture of a state-retaining logic cell 100, according to an example of the present disclosure. Referring to FIG. 1, the state-retaining logic cell 100 is depicted as including back-to-back inverters 102, 104. The inverter 102 may be designated as a feed-forward inverter, and the inverter 104 may be designated as a feedback inverter. An input pass gate 106 may be connected to one of the inverter nodes (i.e., an input node) 108, and an output pass gate 110 may be connected to the other inverter node 112 (i.e., an output node). The input pass gate 106 and the output pass gate 110 may provide functions such as connecting/disconnecting the state-retaining logic cell 100 from other components of a device that includes the state-retaining logic cell 100. For example, the input pass gate 106 may control input of signals to the state-retaining logic cell 100 and the output pass gate 110 may control output of signals from the state-retaining logic cell 100. A terminal of a first NVM storage cell 114 (i.e., an input node NVM storage cell) may be attached at the input node 108, with an opposite terminal of the first NVM storage cell 114 being attached to a programming rail 116. A second NVM storage cell 118 (i.e., an output node NVM storage cell) may be attached to the output node 112, and may be similarly attached to the programming rail 116. In the example of FIG. 1, the first and second NVM storage cells 114, 118 may be bipolar ReRAM storage cells. Generally, the first and second NVM storage cells 114, 118 may be bipolar devices where polarity between switching from a low to a high resistance level (e.g., a reset operation) is reversed compared to switching between the high and the low resistance level (e.g., a set operation). The input node 108 that is connected to the first NVM storage cell 114 may include a sub-circuit including a resistor 120 and a capacitor 122. The value of the resistor 120 may control the amount of charge stored in the capacitor 122, and thus control the current that flows from the NVM storage cell 114. The output node 112 that is connected to the second NVM storage cell 118 may include a sub-circuit including a similar resistor/capacitor arrangement as the input node 108 to control the current that flows from the NVM storage cell 118.

The input node 108 may be driven through the input pass gate 106 so as to overcome the feedback inverter 104. The feed-forward inverter 102 may force the output node 112 to the opposite state of the input node 108. The first and second NVM storage cells 114, 118 may provide for bipolar writes at a voltage of approximately plus (or minus) V (e.g., $V_{DD}$), and reads at a voltage of approximately V/2 (e.g., ½ $V_{DD}$). Further, the first and second NVM storage cells 114, 118 may be placed in the state-retaining logic cell 100 such that a high resistance state (HRS) is programmed when the terminal attached to an inverter node is negative with respect to the terminal attached to the programming rail 116 (denoted herein as approximately +V). The first and second NVM storage cells 114, 118 may be placed in the state-retaining logic cell 100 such that a low resistance state (LRS) is programmed when the write polarity is reversed (denoted herein as approximately −V).

During a normal operation state (i.e., operations other than programming of the state-retaining logic cell 100, or power up of a device including the state-retaining logic cell 100), the programming rail 116 may be held at a voltage of approximately V/2 volts (e.g., ½ $V_{DD}$) such that the NVM storage cells 114, 118 may have the reading voltage of approximately V/2 across their terminals, and are therefore inactive. Thus, the NVM storage cells 114, 118 may be designed such that the current sourced or sunk therethrough in the normal operation state is negligible relative to the drive strength of the feed-forward and feedback inverters 102, 104, respectively.

For programming the state-retaining logic cell 100, the programming rail 116 may pulse low to approximately 0 volts (e.g., ground) as shown 124 from a voltage of approximately V/2 volts (e.g., ½ $V_{DD}$). Thereafter, the programming rail 116 may pulse high to approximately V volts (e.g., $V_{DD}$), and then revert back to a voltage of approximately V/2 volts (e.g., ½ $V_{DD}$). Thus, for programming the state-retaining logic cell 100, a complete cycle of the programming rail 116 may include a pulse low to approximately 0 volts from a voltage of approximately V/2 volts (e.g., ½ $V_{DD}$), a pulse high to approximately V volts (e.g., $V_{DD}$), and a return back to approximately V/2 volts (e.g., ½ $V_{DD}$). A high-low pulse sequence may be similarly used instead of the low-high pulse sequence for programming the state-retaining logic cell 100. During the low period, the NVM storage cell 114 or 118 attached to the high node (e.g., the input node 108 or the output node 112) will have the full write voltage of approximately −V volts applied across it, programming it into the LRS (e.g., into a set state), and the other ReRAM storage cell will have approximately 0 volts applied and will not be programmed. Additionally, during the high period, the NVM storage cell 114 or 118 attached to the low node (e.g., the input node 108 or the output node 112) will have the full write voltage of approximately +V volts applied across it, programming it into the HRS (e.g., into a reset state), and the other ReRAM storage cell will have approximately 0 volts applied and will not be programmed. The NVM storage cells 114 and 118 will retain their respective HRS or LRS until programmed again, even after a circuit including the state-retaining logic cell 100 is powered down.

According to an example, for programming the state-retaining logic cell 100, assuming that during the low period of the programming rail 116, the NVM storage cell 114 attached to the high node (e.g., the input node 108) will have the full write voltage of approximately −V volts applied across it, programming it into the LRS, in this case the NVM storage cell 118 will have approximately 0 volts applied and will not be programmed. Similarly, assuming that during the low period of the programming rail 116, the NVM storage cell 118 attached to the high node (e.g., the output node 112) will have the full write voltage of approximately −V volts applied across it, programming it into the LRS, in this case the NVM storage cell 114 will have approximately 0 volts applied and will not be programmed. Likewise, assuming that during the high period of the programming rail 116, the NVM storage cell 114 attached to the low node (e.g., the input node 108) will have the full write voltage of approximately +V volts applied across it, programming it into the HRS, in this case the NVM storage cell 118 will have approximately 0 volts applied and will not be programmed. Similarly, assuming that during the high period of the programming rail 116, the NVM storage cell 118 attached to the low node (e.g., the output node 112) will have the full write voltage of approximately +V volts applied across it, programming it into the HRS, in this case the NVM storage cell 114 will have approximately 0 volts applied and will not be programmed. The input node 108 or the output node 112 may be designated as a high node or as a low node based on the values stored in the state-retaining logic cell 100. Thus, if the input node 108 is designated as a high node, the output node 112 may be designated as a low node, and vice versa.

Upon power up of a circuit including the state-retaining logic cell 100, the programming rail 116 may be brought to approximately V/2 volts (e.g., ½ $V_{DD}$) before raising the power rail of the feed-forward and feedback inverters 102, 104, respectively. In the approximately V/2 volts state of the programming rail 116, the LRS NVM storage cell may dump current onto its respective inverter node (e.g., the input node 108 or the output node 112). When the power for the feed-forward and feedback inverters 102, 104, respectively, is ramped to approximately V volts (e.g., $V_{DD}$), the imbalance created by the LRS NVM storage cell tips the state-retaining logic cell 100 toward pulling the LRS side of the inverter pair high (i.e., the same state that the LRS side of the inverter pair was in when the NVM storage cells 114 and 118 were last programmed). Thus, when the power for the feed-forward and feedback inverters 102, 104 is ramped to approximately V volts, the state-retaining logic cell 100 may revert back to its original state before being powered down.

Figure 2:
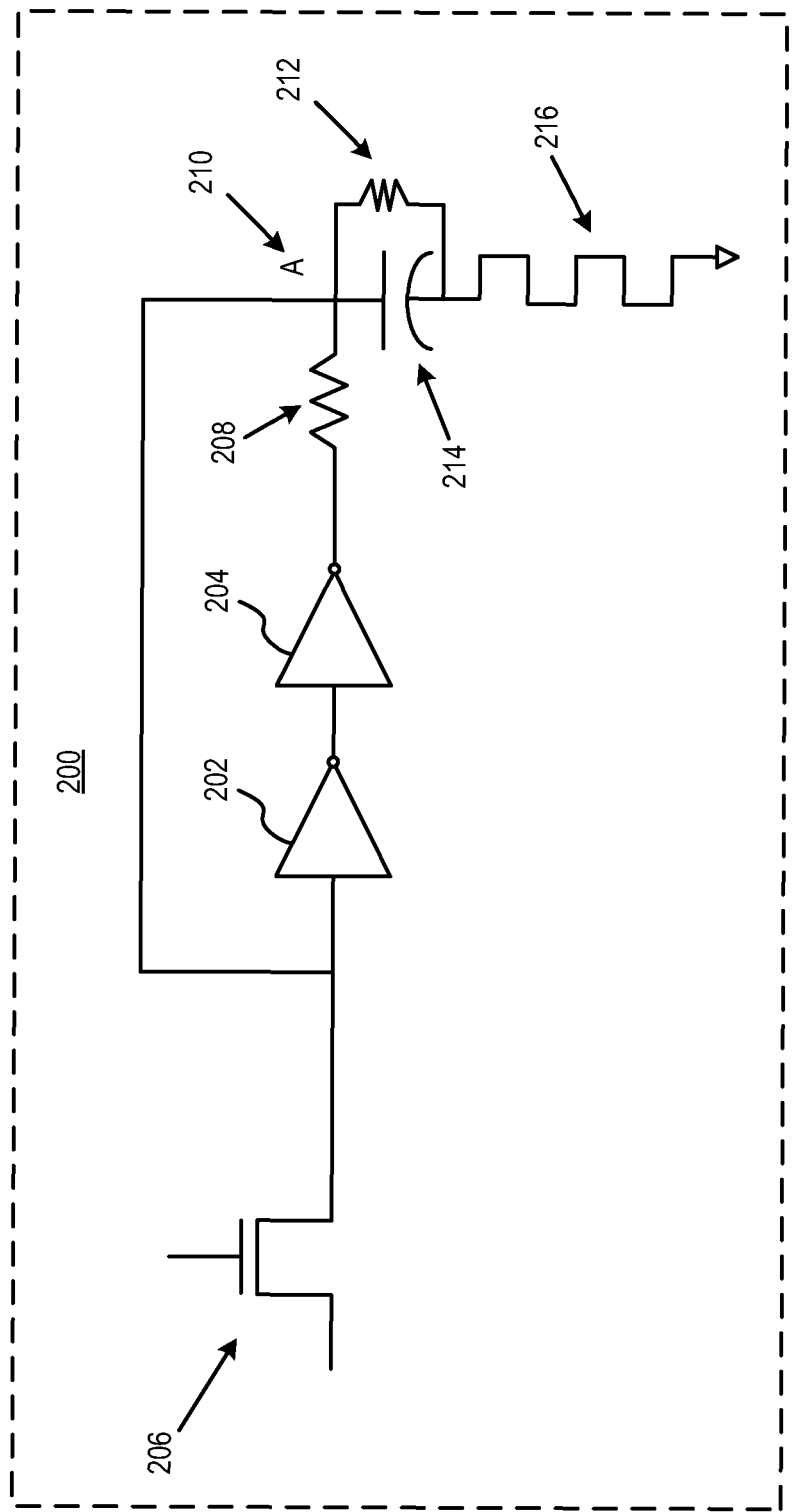
FIG. 2 illustrates another architecture of the state-retaining logic cell, according to an example of the present disclosure.

FIG. 2 illustrates another architecture of a state-retaining logic cell 200, according to an example of the present disclosure. The state-retaining logic cell 200 may include inverters 202, 204 disposed in a series arrangement. The inverters 202 and 204 may be designated as feed-forward inverters. A pass gate 206 may be connected to the inverter 202. A resistor 208 may be provided at the output of the inverter 204 between the output of the inverter 204 and a node 210 (e.g., at location A). The resistor 208 may ensure that during normal operation, an application of a new value on the input node adjacent the inverter 202 through the pass gate 206 may overcome the feedback of the inverter 204 to flip the state of the state-retaining logic cell 200. The node 210 is thus connected adjacent an output node of the inverter 204. The node 210 may include a resistor 212 and a capacitor 214. The node 210 may be connected to a NVM storage cell 216 (i.e., an output node NVM storage cell). In the example of FIG. 2, the NVM storage cell 216 may be a bipolar ReRAM storage cell. Generally, the state of the NVM storage cell 216 may be set for each state change of the state-retaining logic cell 200. Thus, compared to the state-retaining logic cell 100 that uses the programming rail 116, the state-retaining logic cell 100 may set the state of the NVM storage cell 216 for each state change of the state-retaining logic cell 200.

In order to set the NVM storage cell 216 to a HRS, a static high voltage at location A may take the NVM storage cell 216 to a HRS. For example, if a high voltage is applied to location A, a current flows through the resistor 212 and through the NVM storage cell 216 to ground to set the NVM storage cell 216 to a HRS (assuming the NVM storage cell 216 is configured such that current flowing from the location A to ground sets the NVM storage cell 216 to the HRS).

In order to set the NVM storage cell 216 to a LRS, for a high voltage to a low voltage transition at location A, a negative pulse is sent through the NVM storage cell 216 to set the NVM storage cell 216 to a LRS. For example, for a high voltage to a low voltage transition at location A, when the location A is at a high voltage, the capacitor 214 is charged. When the voltage at location A transitions from the high voltage to a low voltage, the voltage at the bottom of the capacitor is sent to a negative value, which sends a current in an upward direction of the NVM storage cell 216 in the orientation of FIG. 2, therefore setting the NVM storage cell 216 to a LRS.

The resistor 212 may also add reliability to the operation of the state-retaining logic cell 200 over repeated setting of NVM storage cell 216 such that the state-retaining logic cell 200 returns to the correct state. For example, the value of the resistor 212 may control the amount of charge stored in the capacitor 214, and thus control the current that flows through the NVM storage cell 216 during the high and low transitions as described above. The resistor 212 may also provide a shunt path for single event upset (SEU) current by draining the charge of the capacitor 214 so as to avoid an error event.

Figure 3:
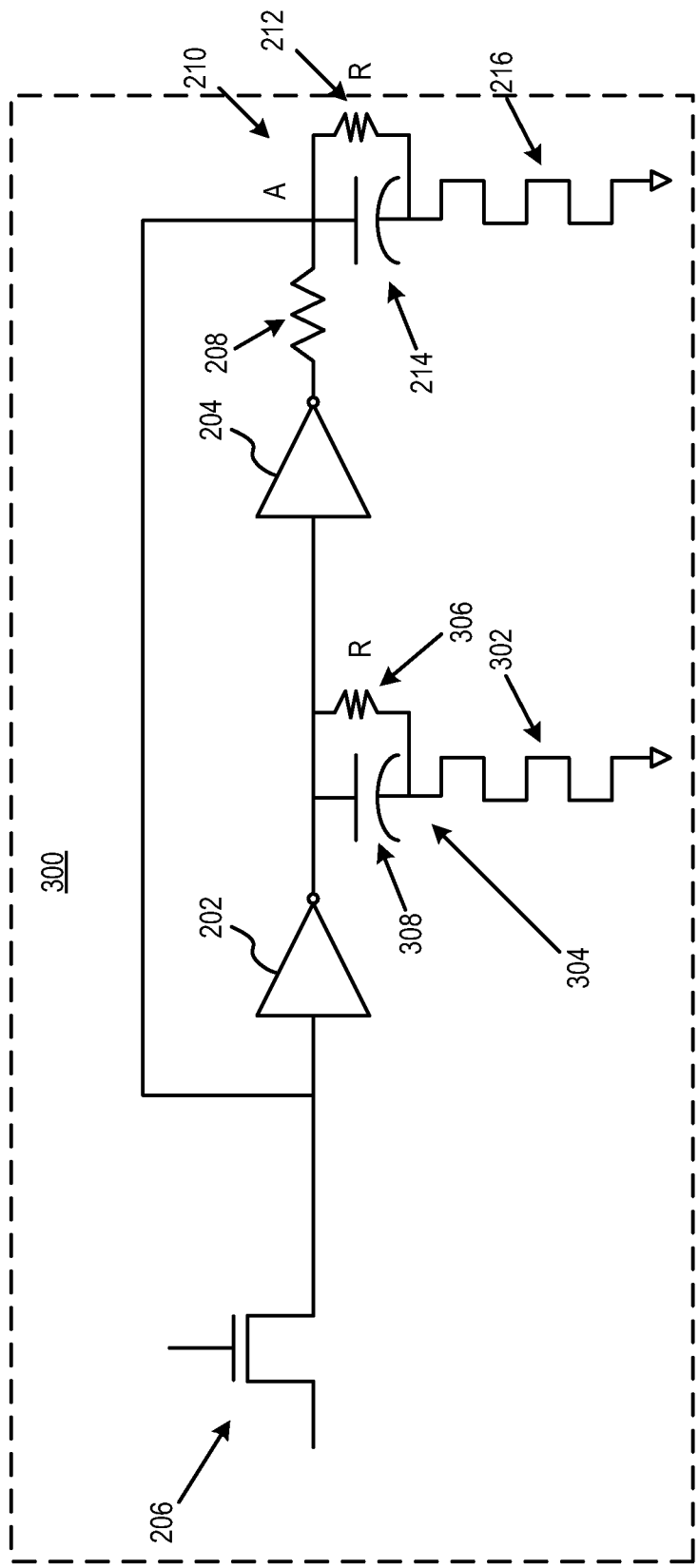
FIG. 3 illustrates another architecture of the state-retaining logic cell, according to an example of the present disclosure.
Figure 4:
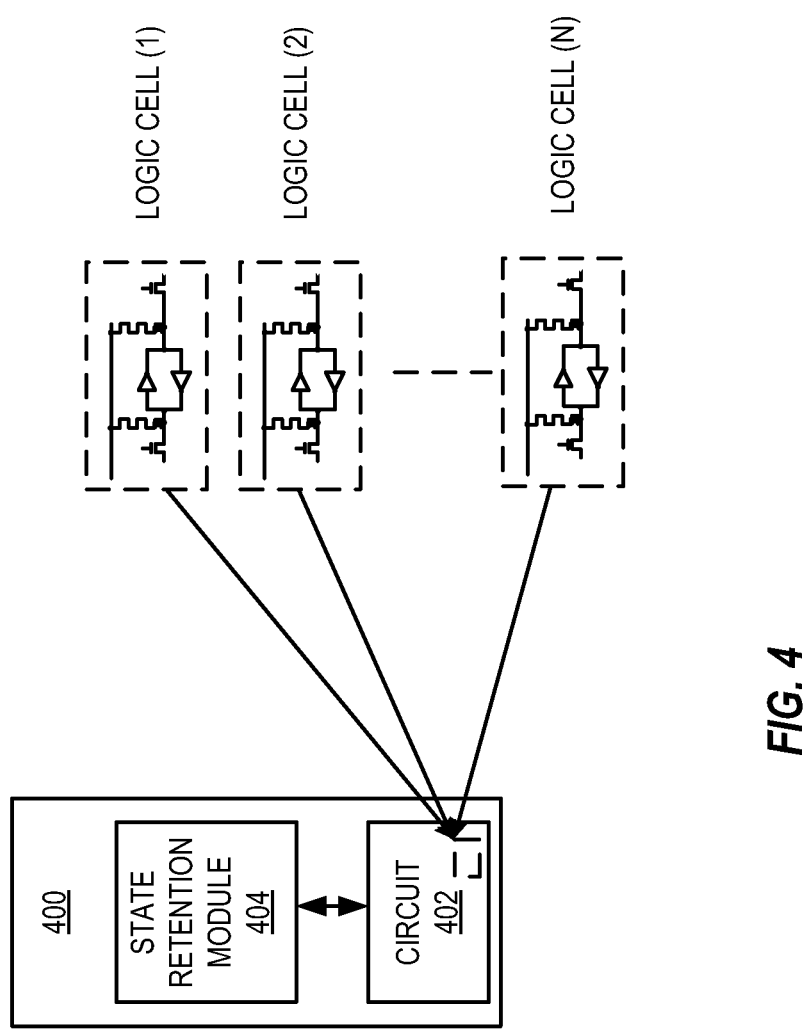
FIG. 4 illustrates a device including a circuit that includes a plurality of state-retaining logic cells, according to an example of the present disclosure.

Referring to FIGS. 1-3, FIG. 3 illustrates another architecture of a state-retaining logic cell 300 according to an example. The state-retaining logic cell 300 may include a further NVM storage cell 302, and another node 304 including a resistor 306 and a capacitor 308. The use of the NVM storage cell 302 provides a further element, in addition to the NVM storage cell 216, for state retention for the state-retaining logic cell 300. The NVM storage cells 216 and 302 may ensure that the input to either the inverter 202 or the inverter 204 will be pulled low when the state-retaining logic cell 300 is powered up. Further, for the state-retaining logic cell 200 that does not include the NVM storage cell 302, components of the inverter 204 may be made sufficiently strong to output a high on power-up of the state-retaining logic cell 200 when the NVM storage cell 216 is in a HRS.

The state-retaining logic cells 100, 200, and 300 may also include pass gate transistors on the NVM components (e.g., the NVM storage cells 114 and 118 for the state-retaining logic cell 100, and similarly for the state-retaining logic cells 200 and 300) to eliminate current draw during non-refreshing periods of operation.

Referring to FIGS. 1-4, FIG. 4 illustrates a device 400 including a circuit 402 that includes a plurality of state-retaining logic cells 100, 200, and/or 300 (e.g., logic cells (1)-(N)) according to an example. The device 400 may include, for example, a cell phone, a personal digital assistant (PDA), household electronics, and generally any device that may be powered up or powered down. A state retention module 404 may control the circuit and the state-retaining logic cells 100, 200, and/or 300 to routinely store a logic state of the device 400 and/or the circuit 402 in real time, for example, at each state change, at detection of imminent power down, or at other selected times. The state-retaining logic cells 100, 200, and 300 may provide for higher incidences of entry into low power states for the device 400, faster device restart after a power loss, and faster device start and restart by application of reset values stored in the state-retaining logic cells.

The module 404 and various other components of the state-retaining logic cells 100, 200, and 300, and the device 400 that may use and operate the state-retaining logic cells 100, 200, and 300, may comprise machine readable instructions stored on a non-transitory computer readable medium. In addition, or alternatively, the module 404 and various other components of the state-retaining logic cells 100, 200, and 300, and the device 400 that may use and operate the state-retaining logic cells 100, 200, and 300, may comprise hardware or a combination of machine readable instructions and hardware.

Figure 6:
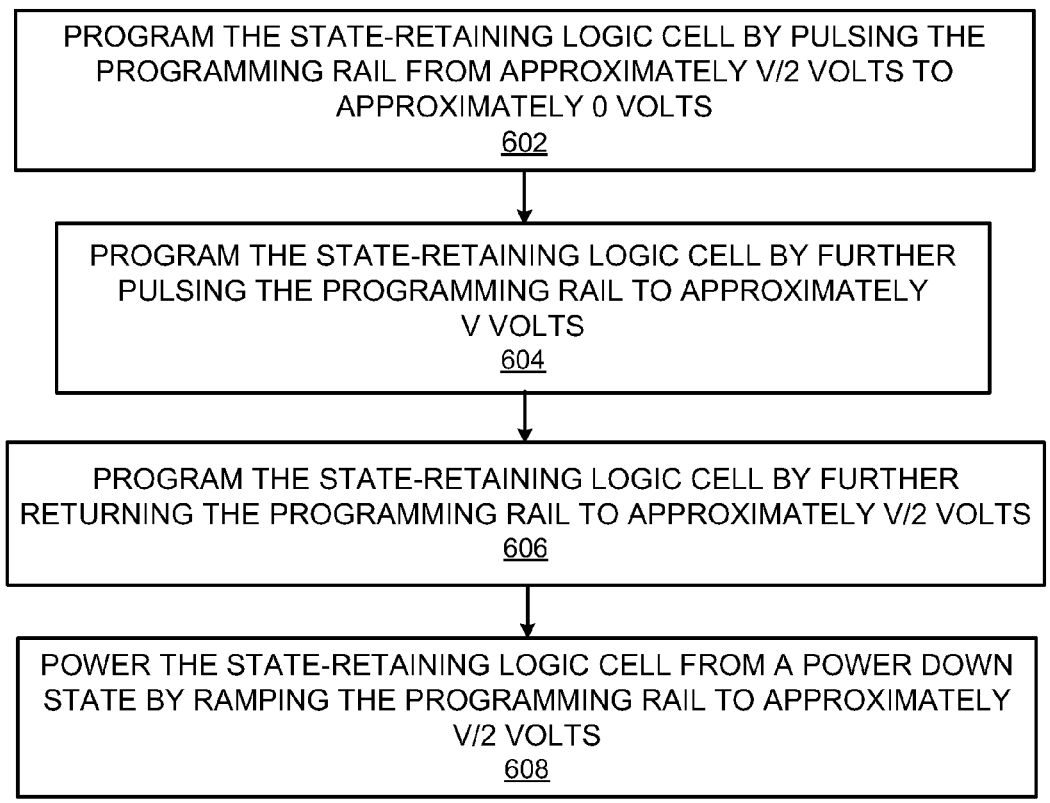
FIG. 6 illustrates further details of the method for state retention for a state-retaining logic cell, according to an example of the present disclosure.

FIGS. 5 and 6 respectively illustrate flowcharts of methods 500 and 600 for state retention for a state-retaining logic cell, corresponding to the example of the state-retaining logic cell 100 whose construction is described in detail above. The methods 500 and 600 may be implemented on the state-retaining logic cell 100 with reference to FIG. 1 by way of example and not limitation. The methods 500 and 600 may be practiced in other apparatus.

Referring to FIG. 5, for the method 500, at block 502, in order to program a state-retaining logic cell, a programming rail may be pulsed from approximately V/2 volts to approximately 0 volts. For example, referring to FIG. 1, the programming rail 116 may be pulsed as shown at 124 from approximately V/2 volts to approximately 0 volts (e.g., ground).

At block 504, the programming rail may be further pulsed to approximately V volts. For example, referring to FIG. 1, the programming rail 116 may pulse high to approximately V volts (e.g., $V_{DD}$).

At block 506, the programming rail may be further returned to approximately V/2 volts. For example, referring to FIG. 1, the programming rail 116 may revert back to approximately V/2 volts (e.g., ½ $V_{DD}$).

Referring to FIG. 6, for the method 600, at block 602, in order to program a state-retaining logic cell, a programming rail may be pulsed from approximately V/2 volts to approximately 0 volts. For example, referring to FIG. 1, the programming rail 116 may be pulsed as shown at 124 from approximately V/2 volts to approximately 0 volts (e.g., ground).

At block 604, the programming rail may be further pulsed to approximately V volts. For example, as shown in FIG. 1, the programming rail 116 may pulse high to approximately V volts (e.g., $V_{DD}$). Further, programming the state-retaining logic cell may include applying a full write voltage of approximately –V volts to one of the first and second NVM storage cells attached to a high node of the inverters to program the NVM storage cell attached to the high node to a LRS during a low period, where the high node is one of the input and output nodes of the inverters, and applying approximately 0 volts to the other one of the first and second NVM storage cells such that the other one of the first and second NVM storage cells is not programmed. Further, programming the state-retaining logic cell may include applying a full write voltage of approximately +V volts to one of the first and second NVM storage cells attached to a low node of the inverters to program the NVM storage cell attached to the low node to a HRS during a high period, where the low node is one of the input and output nodes of the inverters, and applying approximately 0 volts to the other one of the first and second NVM storage cells such that the other one of the first and second NVM storage cells is not programmed.

At block 606, the programming rail may be further returned to approximately V/2 volts. For example, as shown in FIG. 1, the programming rail 116 may revert back to approximately V/2 volts (e.g., ½ $V_{DD}$).

At block 608, powering the state-retaining logic cell from a power down state may include ramping the programming rail to approximately V/2 volts. For example, referring to FIG. 1, upon power up of a circuit including the state-retaining logic cell 100, the programming rail 116 may be brought to approximately V/2 volts (e.g., ½ $V_{DD}$) before raising the power rail of the feed-forward and feedback inverters 102, 104, respectively. Further, powering the state-retaining logic cell from a power down state may further include increasing power for the feed-forward and a feed-back inverters to approximately V volts such that an imbalance created by a LRS NVM storage cell provides for the state-retaining logic cell to pull a LRS side of the feed-forward and a feed-back inverters high. For example, referring to FIG. 1, when the power for the feed-forward and feedback inverters 102, 104, respectively, is ramped to approximately V volts (e.g., $V_{DD}$), the imbalance created by the LRS NVM storage cell tips the state-retaining logic cell 100 toward pulling the LRS side of the inverter pair high (i.e., the same state that the LRS side of the inverter pair was in when the NVM storage cells 114 and 118 were last programmed).

Figure 7:
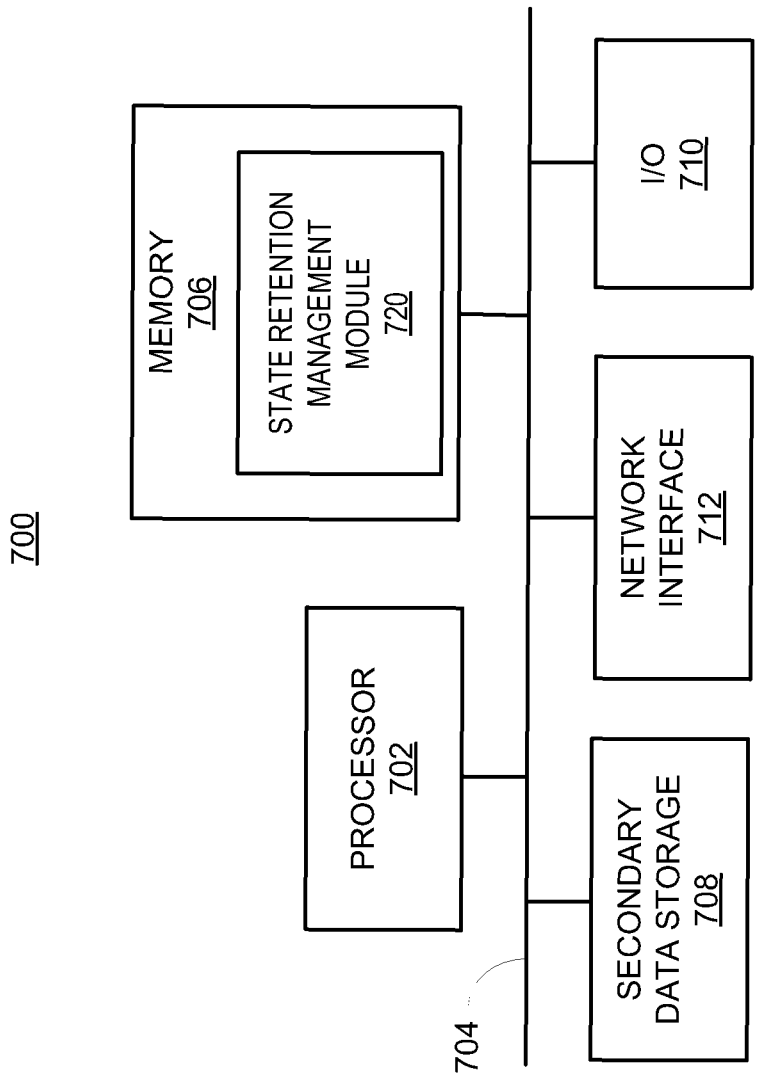
FIG. 7 illustrates a computer system, according to an example of the present disclosure.

FIG. 7 shows a computer system 700 that may be used with the examples described herein. The computer system 700 represents a generic platform that includes components that may be in a server or another computer system. The state-retaining logic cells 100, 200, and/or 300 may be implemented using a variety of digital logic circuits, such as system-on-chip (SoC), application-specific integrated circuit (ASIC), etc. Additionally or alternatively, the computer system 700 may be used as a platform for the state-retaining logic cells 100, 200, and/or 300, and/or the device 400 that may use and operate the state-retaining logic cells 100, 200, and/or 300. The computer system 700 may execute, by a processor or other hardware processing circuit, the methods, functions and other processes described herein. These methods, functions and other processes may be embodied as machine readable instructions stored on a computer readable medium, which may be non-transitory, such as hardware storage devices (e.g., RAM (random access memory), ROM (read only memory), EPROM (erasable, programmable ROM), EEPROM (electrically erasable, programmable ROM), hard drives, and flash memory).

The computer system 700 includes a processor 702 that may implement or execute machine readable instructions performing some or all of the methods, functions and other processes described herein. Commands and data from the processor 702 are communicated over a communication bus 704. The computer system also includes a main memory 706, such as a random access memory (RAM), where the machine readable instructions and data for the processor 702 may reside during runtime, and a secondary data storage 708, which may be non-volatile and stores machine readable instructions and data. The memory and data storage are examples of computer readable mediums. The memory 706 may include a state retention management module 720 including machine readable instructions residing in the memory 706 during runtime and executed by the processor 702. The state retention management module 720 may include the module 404 of the device 400 shown in FIG. 4, and various other components of the device 400 that may use and operate the state-retaining logic cells 100, 200, and/or 300, and various components of the state-retaining logic cells 100, 200, and/or 300.

The computer system 700 may include an I/O device 710, such as a keyboard, a mouse, a display, etc. The computer system may include a network interface 712 for connecting to a network. Other known electronic components may be added or substituted in the computer system.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. A state-retaining logic cell comprising:
   a plurality of inverters comprising a feed-forward inverter and a feed-back inverter disposed in a back-to-back and series arrangement relative to each other;
   an output node comprising:
   an output node non-volatile memory (NVM) storage cell including first and second terminals, the output node NVM storage cell first terminal being connected adjacent an output node of the feed-forward and the feed-back inverters, and the output node NVM storage cell second terminal being connected to a programming rail; and
   a resistor disposed in parallel to a capacitor to control an amount of charge stored in the capacitor and to control current flow through the output node NVM storage cell; and
   an input node NVM storage cell including first and second terminals, the input node NVM storage cell first terminal being connected adjacent an input node of the feed-forward and the feed-back inverters, and the input node NVM storage cell second terminal being connected to the programming rail.

2. The state-retaining logic cell according claim 1, further comprising an input pass gate at the input node of the feed-forward and the feed-back inverters and an output pass gate at the output node of the feed-forward and the feed-back inverters.

3. The state-retaining logic cell according claim 1, wherein the output node NVM storage cell includes a terminal that is grounded.

4. The state-retaining logic cell according claim 1, further comprising an input pass gate at an input node of one of the inverters.

5. The state-retaining logic cell according claim 1, wherein the output node NVM storage cell is designated a first NVM storage cell, wherein the state-retaining logic cell further comprises a further NVM storage cell connected to an input node of the inverter including the adjacently connected first NVM storage cell.

6. The state-retaining logic cell of claim 1, wherein the output node NVM storage cell and the input node NVM storage cell are each bipolar resistive random-access memory (ReRAM) storage cells.

7. A method of state retention for a state-retaining logic cell comprising feed-forward and feed-back inverters disposed in a back-to-back arrangement relative to each other, and first and second non-volatile memory (NVM) storage cells each including first and second terminals, the first terminals of the first and second NVM storage cells being respectively connected to input and output nodes of the inverters, and the second terminals of the first and second NVM storage cells being respectively connected to a programming rail, the method comprising:
programming the state-retaining logic cell by:
pulsing the programming rail from approximately V/2 volts to approximately 0 volts,
further pulsing the programming rail to approximately V volts, and
further returning the programming rail to approximately V/2 volts.

8. The method of claim 7, wherein the NVM storage cells are bipolar resistive random-access memory (ReRAM) storage cells.

9. The method of claim 7, wherein programming the state-retaining logic cell further comprises:
applying a full write voltage of approximately −V volts to one of the first and second NVM storage cells attached to a high node of the inverters to program the NVM storage cell attached to the high node to a low resistance state (LRS) during a low period, wherein the high node is one of the input and output nodes of the inverters; and
applying approximately 0 volts to the other one of the first and second NVM storage cells such that the other one of the first and second NVM storage cells is not programmed.

10. The method of claim 7, wherein programming the state-retaining logic cell further comprises:
applying a full write voltage of approximately +V volts to one of the first and second NVM storage cells attached to a low node of the inverters to program the NVM storage cell attached to the low node to a high resistance state (HRS) during a high period, wherein the low node is one of the input and output nodes of the inverters; and
applying approximately 0 volts to the other one of the first and second NVM storage cells such that the other one of the first and second NVM storage cells is not programmed.

11. The method of claim 7, further comprising:
powering the state-retaining logic cell from a power down state by ramping the programming rail to approximately V/2 volts.

12. The method of claim 11, wherein powering the state-retaining logic cell from a power down state further comprises:
increasing power for the feed-forward and a feed-back inverters to approximately V volts such that an imbalance created by a low resistance state (LRS) NVM storage cell provides for the state-retaining logic cell to pull a LRS side of the feed-forward and a feed-back inverters high.

13. A state-retaining logic cell comprising:
a plurality of invertors disposed in a series arrangement relative to each other; and
an output node non-volatile memory (NVM) storage cell connected adjacent an output node of one of the inverters, wherein the output node includes a resistor disposed in parallel to a capacitor to control an amount of charge stored in the capacitor and to control current flow through the output node NVM storage cell.

14. The state-retaining logic cell of claim 13, wherein the output node NVM storage cell is designated a first NVM storage cell, wherein the state-retaining logic cell further comprises a further NVM storage cell connected to an input node of the inverter including the adjacently connected first NVM storage cell.

15. The state-retaining logic cell of claim 13, wherein the input and output node NVM storage cells are bipolar resistive random-access memory (ReRAM) storage cells.

16. The state-retaining logic cell of claim 13, further comprising an input pass gate at the input node of the feed-forward and the feed-back inverters and an output pass gate at the output node of the feed-forward and the feed-back inverters.

17. The state-retaining logic cell of claim 13, wherein the output node NVM storage cell includes a terminal that is grounded.

18. The state-retaining logic cell of claim 13, further comprising an input pass gate at an input node of one of the inverters.

\* \* \* \* \*